United States Patent [19]

DeBusk

[11] Patent Number: 5,605,602
[45] Date of Patent: Feb. 25, 1997

[54] METHOD AND DEVICE FOR REMOVING A THIN FILM FROM A WAFER BACKSIDE SURFACE

[75] Inventor: Damon K. DeBusk, Austin, Tex.

[73] Assignee: Advanced Micro Devices, Inc., Sunnyvale, Calif.

[21] Appl. No.: 303,186

[22] Filed: Sep. 8, 1994

[51] Int. Cl.⁶ .................................................. H01L 21/306
[52] U.S. Cl. ..................................... 156/646.1; 156/657.1; 437/12
[58] Field of Search .......................... 156/646.1, 657.1; 437/10, 11, 12, 228

[56] References Cited

U.S. PATENT DOCUMENTS

| | | | |
|---|---|---|---|
| 5,075,256 | 12/1991 | Wang et al. | 156/646.1 X |
| 5,370,741 | 12/1994 | Bergman | 156/646.1 X |
| 5,389,551 | 2/1995 | Kamakura et al. | 437/12 X |

OTHER PUBLICATIONS

DeBusk, et al., "Practical Gettering in High Temperature Processing", *Semiconductor International*, (May 1992), pp. 124–126.

Runyan, et al., *Semiconductor Integrated Circuit Processing Technology*, (Addison–Wesley Publishing Company, 1990), pp. 428–442.

*Primary Examiner*—Thi Dang
*Attorney, Agent, or Firm*—Kevin L. Daffer; Conley, Rose & Tayon

[57] ABSTRACT

A method and device is provided for removing a thin film from a wafer backside surface. The method and device advantageously removes the thin film without using photoresist masking material or the removal of photoresist material. The thin film at the wafer backside surface is removed without affecting any thin film material on the wafer front surface. As-such, the wafer backside surface is prepared for subsequent dopant ions used for extrinsic gettering of the backside surface. Alternatively, or in addition to dopants used for backside surface gettering, polysilicon can be deposited upon the exposed backside surface to enhance extrinsic gettering properties.

15 Claims, 3 Drawing Sheets

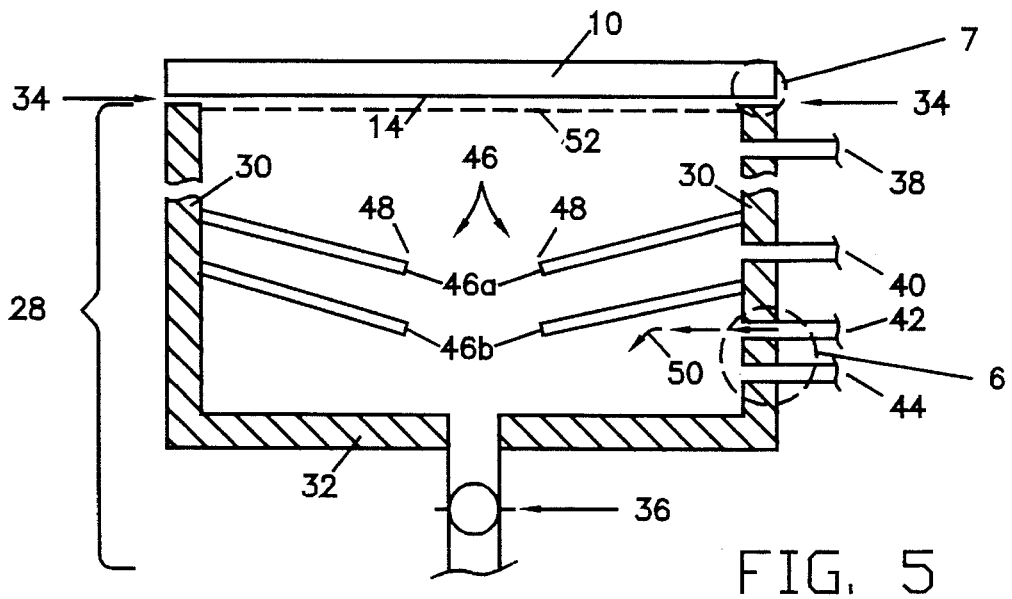
FIG. 5
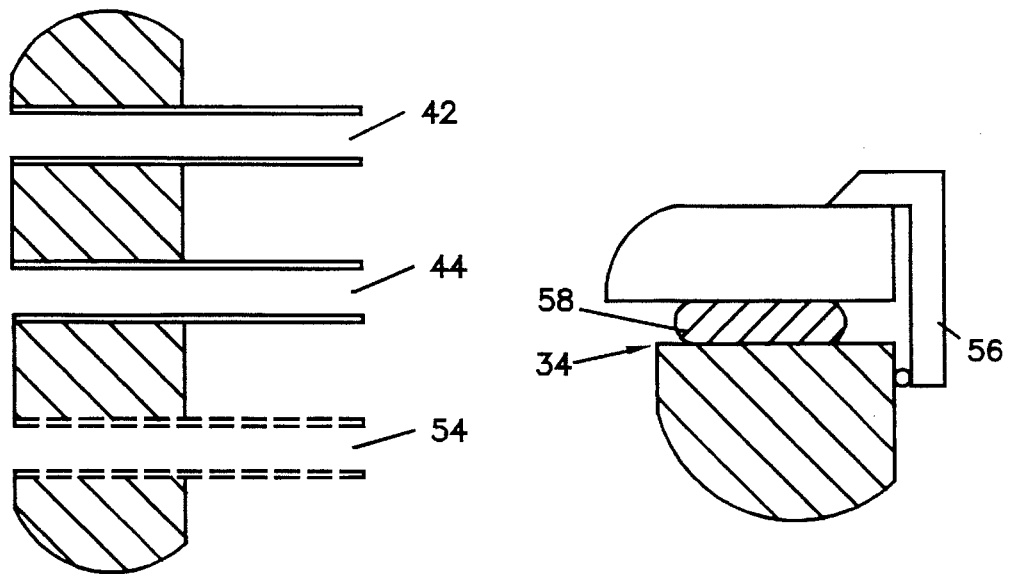
FIG. 6
FIG. 7

METHOD AND DEVICE FOR REMOVING A THIN FILM FROM A WAFER BACKSIDE SURFACE

BACKGROUND OF THE INVENTION

1. Field of the Invention

This invention relates to integrated circuit manufacture and more particularly to a method and device for removing a thin film from a wafer backside surface without requiring deposition and removal of photoresist and the problems associated therewith.

2. Description of the Relevant Art

The process steps of gettering a silicon substrate are well known. Gettering is used to remove lifetime reducing contaminants (usually heavy metals) from regions of the circuit where their presence would degrade device performance. Most all the transition metals, such as gold, copper, iron, titanium, nickel, etc., are reported as possible lifetime reducing contaminants. It is desirable to minimize the presence of such contaminants in the active regions in order to minimize reverse junction leakage, improve bipolar transistor gain, and increase refresh time in dynamic metal oxide silicon (MOS) memories.

Lifetime reducing contaminants (heavy metals) generally derive from at least a couple of sources. First, heavy metals often are found as part of the processing equipment, particularly where stainless steel delivery lines are used, and are naturally derived from that equipment during wafer fabrication. The wafer, unfortunately, receives the deleterious heavy metal ions during, for example, diffusion, chemical vapor deposition (CVD), sputtering, etc., steps. Second, heavy metal ions are often derived from the conductive material placed on the front and backside surfaces of the wafer. Frontside conductive material, generally referred to as "metalization", inherently uses heavy metal materials such as titanium and tungsten to enhance silicide growth and interconnect conductivity. Backside coating of gold is generally used to provide power supply conductivity to the wafer substrate, and also as an aid to bonding of the backside to the chip package. The front and backside heavy metal materials can easily migrate to the active regions to deleteriously effect circuit operations.

In order to sink or trap migration of heavy metal ions away from the active regions, gettering within the bulk silicon is necessary. There are two major forms of gettering: intrinsic gettering and extrinsic gettering. Intrinsic gettering involves forming gettering sites in the bulk of the silicon wafer generally near the active regions (near the front surface of the substrate). Intrinsic gettering generally includes an initial denuding step followed by a nucleation step, and then a precipitation step. Denudation, nucleation and precipitation, in combination, form lattice dislocations in the silicon bulk just below the active regions. The dislocations serve to trap heavy metal ions at the dislocation sites, away from the overlying active regions. Extrinsic gettering, on the other hand, generally involves gettering near the backside surface of the silicon substrate. There are several methods used to perform extrinsic gettering. Two common methods include (i) diffusing phosphorous into the backside surface of the wafer, and/or (ii) depositing polysilicon on the backside surface. Diffusion processes utilizing extrinsic gettering techniques such as phosphorous diffusion and polysilicon deposition is described in Runyan, et al., *Semiconductor Integrated Circuit processing Technology,* (Addision-Wesley publishing Co., 1990), pp. 428–442; and, DeBusk, et al., "Practical Gettering in High Temperature processing", *Semiconductor International,* (May 1992) (both of which are herein incorporated by reference).

It is the enhancement of processing steps used to produce extrinsic gettering that is relevant to the present application. Specifically, minimization and cost effectiveness for performing backside phosphorous diffusion and polysilicon deposition is of primary importance. Current backside phosphorous diffusion techniques involve placing semiconductor wafers on-edge in a wafer boat, and inserting the wafer boat into a diffusion furnace containing n-type dopants (i.e., phosphorous). Thus, the backside surface, as well as the frontside surface, receives phosphorous ions from the diffusion furnace. If polysilicon deposition is chosen as an extrinsic gettering technique, then said deposition occurs via low pressure CVD (LPCVD), wherein the back and front surfaces are both subjected to a silicon vapor source which precipitates as polycrystalline silicon on the front and backside surfaces.

From the above, it is understood that conventional techniques cannot selectively place extrinsic gettering materials (diffused phosphorous and deposited polysilicon) on only the backside surface absent a masking material such as photoresist on the frontside surface. This presents a problem. For example, if phosphorous is to be diffused into the backside surface, there must not be any barrier material, such as thick oxide, on the backside silicon surface. If non-native oxide (oxide generally greater than 70 Angstroms) pre-exists on the backside surface, then phosphorous ions cannot diffuse through that oxide and into the single crystal silicon material. Native oxide is generally less than 20 Angstroms. While it might be apparent that backside diffusion occur prior to thin film deposition (thin film deposition occurring on the front and backside surfaces simultaneously), it is noted that the phosphorous diffusion on the backside surface could harm circuit operation by phosphorous "outgassing" during subsequent thermal oxidation on the frontside surface. Thus, it is important that if phosphorous diffusion is the chosen extrinsic gettering technique, said diffusion must occur after gate oxide is formed on the frontside surface, so as to prevent phosphorous from outgassing into the frontside active regions underneath the gate oxide.

While phosphorous diffusion must occur after frontside oxide growth, it must occur prior to gold deposition on the backside surface and, more particular, before the wafer is subjected to high temperature cycles (i.e., anneal). Anneal steps generally occur in the wafer fabrication cycle after active region implant occurs. Anneal is used to activate the dopants placed in the active regions (source and drain regions) by subjecting the substrate to temperatures exceeding, for example, 1000° C. Accordingly, if backside phosphorous diffusion is used, it must be performed while the backside surface embodies a bare single crystal silicon and before the single crystal silicon is subjected to anneal temperatures. Waiting until the backgrinding procedure would therefore be too late, since backgrinding step occurs after anneal.

From the above, it is understood that phosphorous diffusion, if used as the extrinsic gettering technique, must occur early in the wafer fabrication process, after gate oxide growth and polysilicon deposition. However, it is imperative that gate oxide and polysilicon be present on only the frontside surface so that the backside surface can receive the phosphorous ions. Conventional techniques used to achieve the above generally include growing gate oxide on the front and backside surface as well as thereafter depositing polysilicon on the front and backside surface. In order to remove the polysilicon and underlying gate oxide on the backside surface to prepare the backside surface for receiving gettering phosphorous ions, a masking material must be placed on only the frontside surface. The masking material, i.e., polymerized photoresist, prevents wet etch removal of the underlying polysilicon and gate oxide at the frontside surface while allowing backside removal of exposed polysilicon and gate oxide. The standard process therefore includes the steps of: (i) growing gate and/or tunnel oxide on the front and backside surface, (ii) depositing polysilicon on the front and backside surfaces, (iii) coating photoresist on the frontside surface only, (iv) typically subjecting the wafer to visual inspection to confirm photoresist coverage integrity, (v) polymerizing or baking/curing the photoresist placed on the frontside surface, (vi) removing exposed polysilicon on the backside surface only using a combination nitric acid and ammonium fluoride wet etch material, (vii) removing photoresist on the frontside surface using a ratio of sulfuric acid and hydrogen peroxide wet etch, (viii) removing gate oxide on the backside surface using a ratio of deionized water and hydrofluoric acid, and (x) removing photoresist residue (i.e., gross organics and metallics) using, for example, perchlorethylene and a combination of $H_2O_2$—$NH_4O$, $H_2O_2$—HCl and deionized water. The above steps of coating the front surface with photoresist, baking the photoresist, removing polysilicon, photoresist and oxide on the backside surface is not only time consuming, but also involves expensive, and numerous caustic materials. Additionally, use of photoresist during early stages of wafer processing may minimize the effectiveness of subsequent photolithography and selective polysilicon removal. Still further, any additional use of photoresist should be avoided in a cleanroom environment since photoresist, and the removal thereof, is a relatively "dirty" procedure which can compromise cleanroom integrity. The applicant of the present invention postulates that the cost involved in removal of backside polysilicon and gate oxide to be greater than $6.00 per wafer (assuming a five inch diameter wafer).

For reasons stated above, it would be advantageous to provide extrinsic gettering using backside phosphorous diffusion while avoiding use of the above steps of photoresist coat and removal on the front surface. It would be further advantageous to provide phosphorous deposition at the critical moment of wafer fabrication (i.e., at the time in which polysilicon is exposed at the front and backside surfaces, while the backside surface is absent gate oxide). It would be still further advantageous to provide not only phosphorous diffusion, but also polysilicon deposition on the backside surface subsequent to phosphorous diffusion. The combination of phosphorous diffusion and polysilicon deposition further enhances extrinsic gettering at the backside surface and thereby renders additional advantage in sinking lifetime reducing (heavy metal) contaminants away from the active regions on the front surface of the wafer.

SUMMARY OF THE INVENTION

The problems outlined above are in large part solved by the extrinsic, backside surface gettering technique of the present invention. That is, the present methodology utilizes a more cost effective way to remove thin films from the backside surface of a semiconductor wafer in preparation for subsequently gettering the backside surface. A fumer device hereof is secured to the backside surface for quickly removing gate oxide and/or tunnel oxide prior to polysilicon deposition or, in the alternative, for quickly removing pre-deposited polysilicon and gate oxide (defined herein to include tunnel oxide). Removal is accomplished without affecting the front surface polysilicon and/or gate oxide. The fumer device is sealed to the backside surface immediately after the thin film is formed. The thin film is defined herein as any grown or deposited material including a silicon-containing film such as oxide, nitride, polysilicon or the combination of oxide, nitride and polysilicon. Advantageously, the present method avoids use of a photoresist layer deposited on the front surface, and thereby avoids the cost involved in said photoresist deposition and subsequent removal. Absent photoresist coat, photoresist bake and photoresist removal, the present invention achieves a major cost advantage and process simplification over existing backside extrinsic gettering techniques.

According to one embodiment, a thin film material such as gate and/or tunnel oxide can be removed from the backside surface without affecting oxide on the front side surface. Removal of gate and/or tunnel oxide occurs prior to any polysilicon deposition. Removal of oxides on the backside surface thereby removes the barrier at the backside surface and allows gettering impurities to be placed into the polysilicon and single crystal silicon at the backside surface only. Alternatively, an embodiment is provided herein which can remove layers of thin film such as, for example, polysilicon and gate (and/or tunnel) oxides. The process removes polysilicon first and then underlying oxides using a device which seals against the backside surface. Sealing abutment is provided to effectively remove a single or multiple thin films without breaking the integrity of the seal. Seal engagement allows use of a vapor clean or etch source and avoids use of conventional liquid etchants or cleaning solutions. By avoiding liquid solutions, contamination formed within those solutions during manufacturing or derived from previous wafer dips or room ambients are eliminated. Well understood are the problems associated with liquid etchant materials and the insufficiency of frequent periodic flushes. Even after numerous flush cycles, prior wafer dips can contaminate any subsequent wafer etchings.

Broadly speaking, the present invention contemplates a method for removing a thin film from a wafer backside surface. The method comprises the steps of providing a fumer device having a bowl-shaped receptacle with upwardly directed walls terminating in a rim, and a plurality of ports extending through the walls. A thin film is formed upon exposed front and backside surfaces of a silicon substrate by inserting the silicon substrate into a furnace such that the front and backside surfaces are exposed to a gas flow. Absent any intervening deposition steps after the thin film is formed, the backside surface of the substrate is sealed in a downward direction against the rim of the fumer device. The fumer device receives etchant vapors through one of the plurality of ports. The etchant vapors react with and cause removal of the thin film. Importantly, the etchant vapors are sealed within the fumer device and do not react with or remove thin film existing on the wafer front surface. Thus, removal of the thin film allows for diffusion of gettering ions (dopants) such as phosphorous into the exposed silicon substrate at the backside surface. The extrinsic gettering sites are thereby provided where the diffused dopants exist near the backside surface and away from the front surface containing active regions.

Preferably, the gas flow within the furnace includes either oxygen necessary to grow a thin film consisting of silicon dioxide, or silane necessary to deposit polysilicon adjacent a layer of pre-existing silicon dioxide. The etchant vapors are delivered by preferably bubbling within a sealed chamber an inert gas through a liquid etchant to form etchant vapors and thereafter drawing the etchant vapors from the sealed chamber into the fumer device. The etchant vapors may consist of either hydrofluoric acid vaporized in an inert gas and/or nitric acid vaporized in an inert gas.

The present invention still further contemplates a device for removing a thin film from only a wafer backside surface while leaving the thin film on a wafer front surface. The device comprises a bowl-shaped receptacle having a bottom portion connected to upwardly directed walls. The walls terminate in a rim surrounding an opening into the receptacle. A plurality of ports extend through the walls. The ports comprise an inert gas inlet port, a gas outlet port, a water inlet port, and at least one etchant vapor inlet port. A drain extends through the bottom portion of the bowl-shaped receptacle. At least one pair of baffles extend inward into the receptacle from the walls at an acute angle downward toward the bottom portion. The baffles extend from the walls at a location proximate the walls and above the water inlet ports. The baffles further extend in a location distal the walls below the water inlet port. A compliant, fluid impermeable member is adapted for placement upon the rim, and a latch is coupled to the walls adjacent the rim for fixedly receiving against the compliant member an exposed thin film configured upon a backside surface of a semiconductor wafer. The compliant member substantially prevents egress of etchant vapor released into the receptacle through the etchant vapor inlet port. The etchant vapor reacts with and removes through the gas outlet port the thin film from the wafer.

Preferably, the baffles extend at a location proximate the walls and above the etchant vapor inlet port, and the baffles extend to a location distal the walls below the etchant vapor inlet port. Further, the baffles extend at a location proximate the walls and below the inert gas inlet port, and the baffles extend to a location distal the walls below the inert gas inlet port. Still further, the baffles comprise two pairs of baffles such that one of the pair of baffles extends at a location proximate the walls and above the gas outlet port while the other of the pair of baffles extends at a location proximate the walls and below the gas outlet port.

BRIEF DESCRIPTION OF THE DRAWINGS

Other objects and advantages of the invention will become apparent upon reading the following detailed description and upon reference to the accompanying drawings in which:

FIG. 5 is a cross-sectional view of a fumer device for removing a thin film from a wafer backside surface according to the present invention;

FIG. 6 is a detailed view of area 6 in FIG. 5; and

FIG. 7 is a detailed view of area 7 in FIG. 5.

Figure 1:
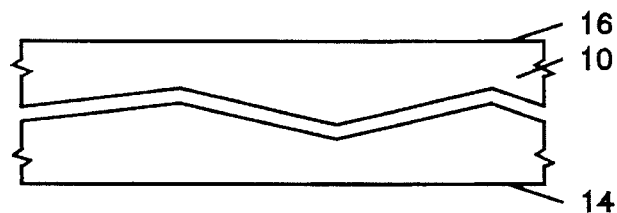
FIG. 1 is a partial cross-sectional view of a silicon substrate to be formed according to the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 2:
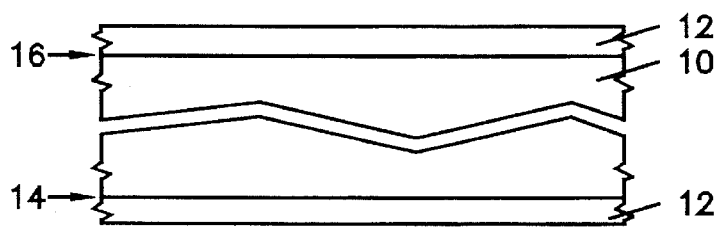
FIG. 2 is a partial cross-sectional view of the silicon substrate having oxide thermally grown on the front and backside surfaces of the silicon substrate according to a subsequent processing step.

Turning now to FIGS. 1 and 2, a partial cross-sectional view of a silicon substrate 10 is shown. Silicon substrate 10 includes any silicon-based, single crystal material having a lattice arranged in any of numerous orientations. FIG. 2 indicates that substrate 10 is capable of thermally growing a gate oxide 12 on exposed surfaces of substrate 10. Gate oxide 12 is formed according to common thermal oxidation procedures using dry or wet oxidation techniques through the following reactions:

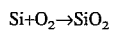

or

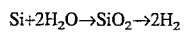

Gate oxide 12 is formed as an initial processing step to a suitable gate oxide thickness, usually around 100 Angstroms. Gate oxide, distinguished from field oxide, is grown to a relatively thin thickness carefully controlled to ensure proper n- and p-channel thresholds. Gate oxide 12 subsequently receives a polysilicon layer (described below) and, according to self-aligned techniques, is selectively removed along with overlying polysilicon to form active regions directly below the remaining gate oxide and polysilicon layers. Thus, the polysilicon layer forms the gate region of a transistor, such as an MOS transistor. The channel region residing below the gate region must be protected from ingress of lifetime reducing heavy metal contaminants. Thus, as described in the embodiment of FIGS. 3a–3c or the embodiment of FIGS. 4a–4d, gettering sites must be formed within substrate 10 below the channel regions. The gettering sites tie up the heavy metal contaminants away from channel (active) regions.

Figure 3A:
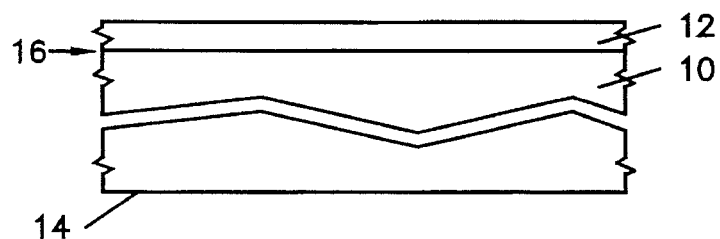
FIGS. 3a–3c are partial cross-sectional views of the silicon substrate conditioned for receiving extrinsic gettering material (dopants and polysilicon) into and on the backside surface of the silicon substrate according to one exemplary embodiment of the present invention.
Figure 3B:
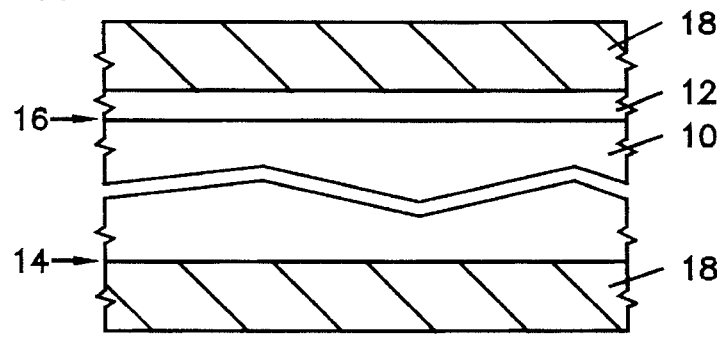
Figure 3C:
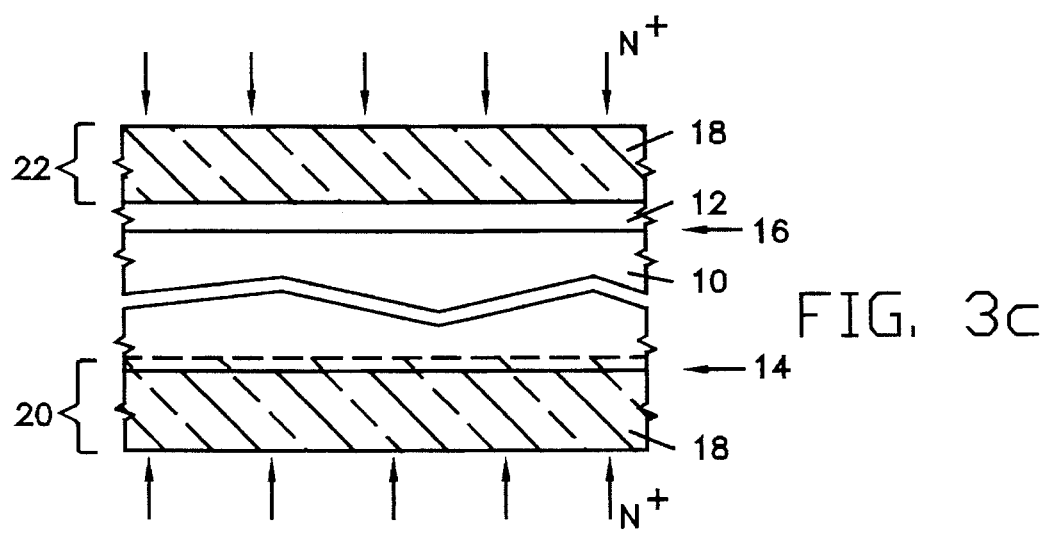

Referring first to the method steps shown in the embodiment of FIGS. 3a–3c, the backside surface 14 is prepared for receiving gettering material (phosphorous dopants, or phosphorous dopants and polysilicon). As the gettering material is placed on backside surface 14, front surface 16 remains unaffected. Shown in FIG. 3a, the first step according to the first embodiment, is to remove gate oxide at backside surface 14. Importantly, gate oxide 12 at the front surface 16 remains and, as described below, forms a barrier against subsequent phosphorous diffusion into front surface 16 of silicon substrate 10.

After gate oxide 12 is removed from backside surface 14, polysilicon 18 is deposited according to conventional CVD techniques, as shown in FIG. 3b. Like gate oxide 12, polysilicon 18 is formed as a thin film on both the front and backside surfaces 16 and 18, respectively. Oxide 12 is thermally grown by placing the wafers on their side in a wafer boat and inserting the wafer boat into a furnace heated to an oxidizing temperature, possibly a moist environment. Polysilicon 18 is deposited on the front and backside surfaces since the wafer front and backside surfaces are exposed to the silicon source vapor within the CVD chamber. Accordingly, it is inherent in oxide growth and polysilicon deposition, that both processes occur at the front and backside surfaces since both surfaces are exposed to the growth and deposition ambients.

Although oxide grows on the front and backside surfaces, as shown in FIG. 2, and polysilicon grows on the front and backside surfaces, as shown in FIG. 3b, intermediate step FIG. 3a indicates that selective removal of only the backside surface oxide 12 occurs to allow direct deposition of polysilicon 18 on the backside surface 14. Conversely, polysilicon 18 is deposited upon gate oxide 12 existing at only the front surface 16.

By depositing polysilicon 18 directly adjacent substrate 10 at the backside surface 14, diffusion of phosphorous ions into the backside surface 14 can occur, as shown by reference numeral 20 in FIG. 3c. Illustrated FIG. 3c is the step of diffusing n-type ions, such as phosphorous, into backside surface 14 to provide extrinsic gettering at the backside surface. Phosphorous ions are shown to naturally diffuse through polysilicon 18 and into substrate 10 at backside surface 14 in accordance with reference numeral 20. At the frontside surface 16, phosphorous ions diffuse only into polysilicon 18 and cannot diffuse through gate oxide 12, as shown by reference numeral 22.

By achieving phosphorous diffusion into single crystal silicon 10 as well as deposition of polysilicon 18 on backside surface 14, the present invention achieves enhanced gettering at the backside surface (i.e., gettering which uses both phosphorous diffusion and polysilicon deposition). Additionally, phosphorous deposition and diffusion through polysilicon 18 simultaneously into the front and backside surface allows the front surface to be diffused active in accordance with conventional polysilicon conductivity requirements in the gate regions. As such, the embodiment shown in FIGS. 3a–3c provide enhanced extrinsic gettering as well as polysilicon gate conductivity. Still further, gettering occurs at the proper moment during semiconductor processing. Namely, phosphorous diffusion occurs after the frontside surface is protected with gate oxide 12 so as to prevent doping of phosphorous to the frontside channel region. In addition, phosphorous diffusion occurs prior to any barrier material, such as an oxide, formed at the backside surface and, especially, before substrate 10 undergoes thermal cycles such as anneals.

Figure 4A:
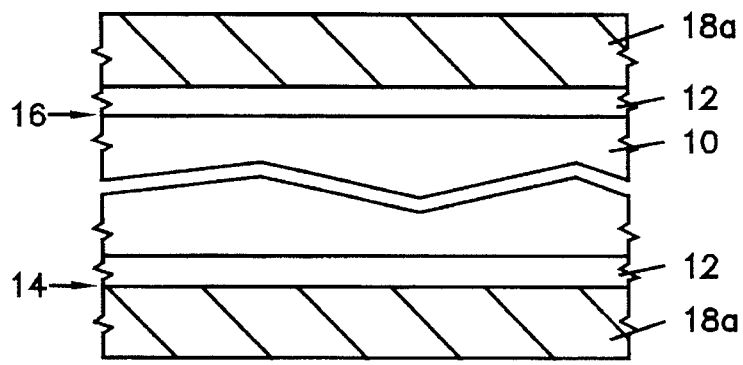
FIGS. 4a–4d are partial cross-sectional views of the silicon substrate conditioned for receiving extrinsic gettering material (dopants only) into the backside surface of the silicon substrate according to another exemplary embodiment of the present invention.
Figure 4B:
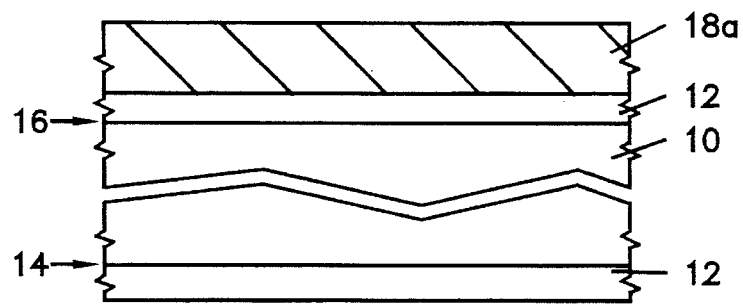
Figure 4C:
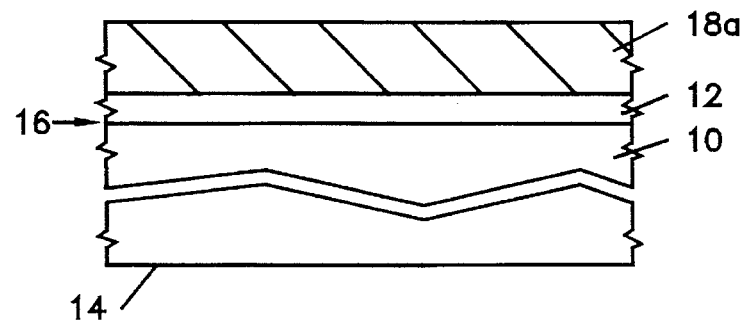
Figure 4D:
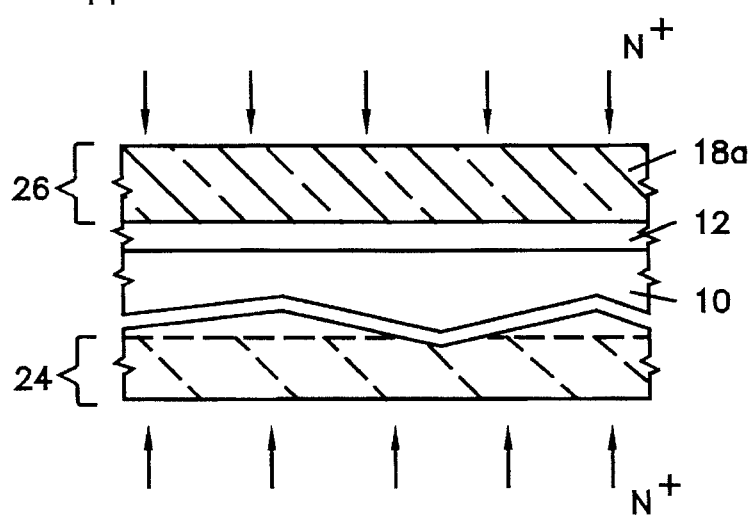

Returning now to the alternative exemplary embodiment methodology steps shown in FIGS. 4a–4d, silicon substrate is shown conditioned for receiving a higher dosage of phosphorous ions at the backside surface absent a polysilicon layer thereon. FIG. 4a is shown to occur after FIG. 2, indicative of polysilicon layers 18a placed on the exposed gate oxide layers 12. Polysilicon layers 18a are formed according to well known LPCVD techniques to present exposed regions of polysilicon 18a, of which the backside surface region of polysilicon 18a is shown subsequently removed in the processing step of FIG. 4b. The exposed gate oxide layer 12 adjacent to backside surface 14 can thereafter be removed in the processing step shown in FIG. 4c. FIG. 4c illustrates exposed backside surface 14 into which phosphorous dopants can be diffused, as shown in FIG. 4d. Thus, instead of diffusing phosphorous dopants through polysilicon 18 adjacent backside surface 14 according to the embodiment shown in FIGS. 3a–3c, the alternative embodiment of FIGS. 4a–4d allows direct diffusion into exposed backside surface 14. Direct diffusion allows for greater dosage of phosphorous dopant into silicon substrate 10 thereby achieving greater lattice disruption and increased gettering site effectiveness. As shown in FIG. 4d, phosphorous diffusion into silicon substrate 10 extends a distance 24 measured from backside surface 14. Distance 24 extends closer to frontside surface 16, where active regions exists. By placing the gettering sites closer to the active regions, the gettering effect can be greatly enhanced and therefore is more desirable in some instances. Similar to that shown in FIG. 3c, phosphorous diffusion at the front surface 16 extends through polysilicon 18a as shown by reference numeral 26, but ceases at gate oxide 12. Thus, the embodiment of FIGS. 4a–4d provide n-type dopants into the polysilicon gate region, similar to the embodiment of FIGS. 3a–3c to provide lower polysilicon conductivity and the advantages thereof.

Referring now to FIGS. 5–7, a fumer device 28 is shown. Fumer device 28 is adapted to receive the backside surface 14 of silicon substrate 10. Specifically, fumer device 28 includes upward extending walls 30 connected to a bottom portion 32. The upward extending walls terminate in a rim 34 which surrounds an opening into device 28. Device 28 is therefore configured similar to a bowl-shaped receptacle having an upward extending opening adapted to receive and sealingly engage with a backside surface of a semiconductor wafer.

Bottom portion 32 contains an opening which extends through the bottom portion, and is fitted with a drain 36. Drain 36 is preferably valved to selectively pass drained material from device 28. Arranged on one or more of the upward extending walls 30 is a set of ports which extend completely through the walls. The ports include an inert gas inlet port 38, a gas outlet port 40, a water inlet port 42 and according to one embodiment, an etchant vapor inlet port 44.

Connected at the inside surface of walls 30 is a baffle arrangement 46. Depending upon the configuration of walls 30, baffle arrangement 46 can include at least one pair of baffles 46a or two pairs of baffles 46a and 46b. Each pair of baffles is arranged to extend from the inner surface of walls 30 at an acute angle downward to a point near the center between walls 30. At the point proximate to walls 30, one pair of baffles 46a connect at the walls above ports 40, 42 and 44, but below port 38. The distal location (location having reference numeral 48) is at an elevational level below the flow direction of gas outlet port 40. If a second pair of baffles 46b is used, then the distal location 48 of baffles 46b is arranged below the flow direction of water inlet port 42. As shown by the arrows indicated by reference numeral 50, water inlet is directed downward toward bottom portion 32 and away from backside surface 14. Thus, baffle 46b is specifically configured to prevent contact of water to the backside surface 14. Water is used to flush contaminants from device 28 after vapor etchant procedure is terminated. Water is flushed by entry into port 42 and exit through drain 36.

During vapor etchant procedures (i.e., during times in which thin film is removed from wafer backside surface 14) and before device 28 is flushed with water, etchant vapor is introduced into and properly vented from device 28. Inlet port 44 receives etchant vapor into device 28, and vent 40 removes reacted thin films from backside surface 14. After the thin film is removed, as shown by reference numeral 52, a heated inert gas, such as argon, is injected via port 38 into device 28. Inert gas vaporizes any condensed wet etch acid remaining on backside surface. Vent 40 allows for removal of the condensed acid.

According to the advantages shown in FIG. 5, and those described herein below, baffle arrangement 46 is configured so that deionized water flow 50 does not splash upward onto the backside surface 14. Additionally, an inert gas inlet port 38 is provided for "blowing off" any residual etchant from backside surface 40 after the etchant procedure is concluded. Still further, each of the input and output ports for etchant vapor, inert gas, deionized water, etc. is configured through walls 30 relative to the proximal and distal locations of baffle arrangement 46.

Referring now to FIG. 6, a detailed view of area 6 in FIG. 5 is illustrated. According to an alternative embodiment, etchant vapor inlet port 44 can be configured with a secondary etchant vapor inlet port 54. Port 54 allows for more than one ingress of etchant vapor, wherein port 44 may carry one type of vapor etchant, and port 54 may carry another. For example, if two different types of thin films are to be removed from backside surface 14, then port 44 may carry the proper etchant for one layer of thin film and port 54 may carry the proper etchant for the other layer. Accordingly, the embodiment shown in FIG. 6 allows for removal of several layers of thin film to provide successive removal of, for example, polysilicon and underlying gate oxide at backside surface 14. During one step, polysilicon etchant vapor can be introduced through, for example, port 44. After polysilicon is removed thereby leaving exposed gate oxide, port 54 can be used to carry gate oxide etchant vapor. By using two etchant vapor inlet ports, the procedural steps of polysilicon and gate oxide removal of FIGS. 4b and 4c can be combined without breaking the sealed integrity of substrate 10 upon fumer device 28.

Referring now to FIG. 7, the sealed integrity of substrate 10 upon device 28 is shown. Specifically, a latching arm 56 reciprocally coupled to walls 30 allows for pressure fitting of substrate 10 upon rim 34 interposed between substrate 10 and rim 34 is a compliant, fluid impermeable member 58. Member 58 forms a fluid impermeable (liquid and gas impermeable) barrier between substrate 10 and device 28 to ensure minimal egress of noxious vapors from device 28. Moreover, member 58 allows for the inner receptacle of device 28 to be pressurized in a vacuum in order to minimize contaminants on backside surface 14 while maximizing etchant vapor access thereto. Of additional importance, member 58 prevents outgassing of etchant vapors from backside surface 14 to frontside surface 16 containing gate and active regions.

Instead of using compliant member 58, Applicant postulates that the weight of wafer 10 is sufficient to form a seal at the upper surface of rim 34. According, member 58 can be omitted as well as latching arm 56 according to an alternative embodiment. Absent member 58 and latching arm 56, wafer 10 resides in sealing engagement with the upper surface of rim 34 and prevents outgassing of etchant vapors and ingress of contaminants, similar to that which is achieved using member 58 and latch 56.

It will be appreciated to those skilled in the art after having the benefit of this disclosure that this invention is believed to be capable of applications with any integrated circuit embodied upon a silicon substrate. Furthermore, it is also to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and change and, accordingly, the specification and drawings are to be regarded in an illustrative rather than a restrictive sense.

What is claimed is:

1. A method for removing a thin film from a wafer backside surface comprising the steps of:

providing a fumer device having a bowl-shaped receptacle with upwardly directed walls terminating in a rim and a plurality of ports extending through said walls;

forming a thin film upon exposed front and backside surfaces of a silicon substrate by inserting said silicon substrate into a wafer boat and introducing said wafer boat into a furnace such that said front and backside surfaces are exposed to a gas flow within said furnace;

without any intervening depositing steps after said forming step, sealing the backside surface of said substrate in a downward direction against the rim of said fumer device; and delivering etchant vapors into said fumer device through one of said plurality of ports, whereby said etchant vapors react with and cause removal of said thin film.

2. The method as recited in claim 1, wherein said gas flow comprises oxygen and said thin film consists of silicon dioxide.

3. The method as recited in claim 1, wherein said gas flow comprises silane and said thin film consists of a layer of polysilicon placed adjacent a layer of thermally grown silicon dioxide.

4. The method as recited in claim 1, wherein said sealing step comprises latching said silicon substrate against said rim to substantially prevent egress of said etchant vapors from said fumer device.

5. The method as recited in claim 1, wherein said delivering step comprises bubbling within a sealed chamber an inert gas through a liquid etchant to form etchant vapors, and drawing said etchant vapors from said sealed chamber into said fumer device.

6. The method as recited in claim 1, wherein said etchant vapors consist of hydrofluoric acid vaporized in an inert gas.

7. The method as recited in claim 1, wherein said etchant vapors consist of nitric acid vaporized in an inert gas.

8. The method as recited in claim 1, further comprising, after said delivering step, placing said silicon substrate into a diffusion chamber whereby dopants within said chamber diffuse into the backside surface of said substrate in areas void of said thin film.

9. A method for providing extrinsic gettering sites near the backside surface of a silicon wafer comprising the steps of:

providing a fumer device having a bowl-shaped receptacle with upwardly directed walls terminating in a rim and a plurality of ports extending through said walls;

forming a thin film upon exposed front and backside surfaces of a silicon substrate by inserting said silicon substrate into a wafer boat and introducing said wafer boat into a furnace such that said front and backside surfaces are exposed to a gas flow within said furnace;

immediately after said forming step and without any intervening depositing steps, sealing the backside surface of said substrate in a downward direction against the rim of said fumer device;

delivering etchant vapors into said fumer device through one of said plurality of ports, whereby said etchant vapors react with and cause removal of said thin film;

placing said silicon substrate into a diffusion chamber whereby dopants within said chamber diffuse into the backside surface of said substrate in areas void of said thin film; and providing an extrinsic gettering sites where the diffused dopants exists near the backside surface.

10. The method as recited in claim 9, wherein said gas flow comprises oxygen and said thin film consists of silicon dioxide.

11. The method as recited in claim 9, wherein said gas flow comprises silane and said thin film consists of a layer of polysilicon placed adjacent a layer of thermally grown silicon dioxide.

12. The method as recited in claim 9, wherein said sealing step comprises latching said silicon substrate against said rim to substantially prevent egress of said etchant vapors from said fumer device.

13. The method as recited in claim 9, wherein said delivering step comprises bubbling within a sealed chamber an inert gas through a liquid etchant to form etchant vapors, and drawing said etchant vapors from said sealed chamber into said fumer device.

14. The method as recited in claim 9, wherein said etchant vapors consist of hydrofluoric acid vaporized in an inert gas.

15. The method as recited in claim 1, wherein said etchant vapors consist of nitric acid vaporized in an inert gas.

* * * * *